US012224197B2

(12) United States Patent
Zhang

(10) Patent No.: US 12,224,197 B2
(45) Date of Patent: Feb. 11, 2025

(54) ELECTRODE PATTERN STRUCTURE OF CONCENTRIC-CIRCULAR-STRUCTURED ELECTROSTATIC CHUCK

(71) Applicant: RAYCER ADVANCED MATERIALS TECHNOLOGY CO., LTD, Yantai (CN)

(72) Inventor: Juxian Zhang, Yantai (CN)

(73) Assignee: RAYCER ADVANCED MATERIALS TECHNOLOGY CO., LTD, Yantai (CN)

( * ) Notice: Subject to any disclaimer, the term of this patent is extended or adjusted under 35 U.S.C. 154(b) by 173 days.

(21) Appl. No.: 18/030,772

(22) PCT Filed: Feb. 19, 2021

(86) PCT No.: PCT/CN2021/076783
§ 371 (c)(1),
(2) Date: Apr. 7, 2023

(87) PCT Pub. No.: WO2022/077820
PCT Pub. Date: Apr. 21, 2022

(65) Prior Publication Data
US 2023/0386881 A1 Nov. 30, 2023

(30) Foreign Application Priority Data

Oct. 12, 2020 (CN) .......................... 202011087867.7

(51) Int. Cl.
*H01T 23/00* (2006.01)
*H01L 21/683* (2006.01)
(52) U.S. Cl.
CPC ................................. *H01L 21/6833* (2013.01)
(58) Field of Classification Search
None
See application file for complete search history.

(56) References Cited

U.S. PATENT DOCUMENTS 5,184,398 A 2/1993 Mosiehi
5,561,585 A * 10/1996 Barnes ................ H01L 21/6831
361/234
(Continued)

FOREIGN PATENT DOCUMENTS

CN 1816909 A 8/2006
CN 102214686 A 10/2011
(Continued)

OTHER PUBLICATIONS

The office action of KR patent application No. 10-2023-7012258 issued on Jul. 23, 2024.
(Continued)

*Primary Examiner* — Stephen W Jackson
(74) *Attorney, Agent, or Firm* — Andrew C. Cheng

(57) ABSTRACT

The present invention provides an electrode pattern structure of a concentric-circular-structured electrostatic chuck, and is related to the field of semiconductor and material science. An electrode unit of an electrostatic chuck is divided into a plurality of size-reduced electrode arc-bands, and by means of arrangement of inter-ring connection openings of the size-reduced electrode arc-bands, the electrodes of the entire electrostatic chuck can be divided into any desired number of electrodes. In the electrode pattern structure of the concentric-circular-structured electrostatic chuck, the electrostatic chuck electrode of such a structure can, on the one hand, minimize division units to be advantageous for reduction of residual thermal stress, and on the other hand, avoid generation of isolated electrode during the process of dividing. This is an electrostatic chuck electrode that has excellent symmetry and has a uniform and simple structure.

12 Claims, 2 Drawing Sheets

(56) References Cited

U.S. PATENT DOCUMENTS

| | | | |
|---|---|---|---|
| 5,812,361 A | 9/1998 | Jones | |
| 2014/0139049 A1 | 5/2014 | Fischer | |
| 2018/0005852 A1 | 1/2018 | Dhindsa | |
| 2020/0219749 A1* | 7/2020 | Lee | H01L 21/67069 |
| 2022/0208591 A1* | 6/2022 | Long | H01L 21/67109 |
| 2022/0310431 A1* | 9/2022 | Deng | H01L 21/6833 |

FOREIGN PATENT DOCUMENTS

| | | | |
|---|---|---|---|
| CN | 108475658 A | 8/2018 | |
| CN | 109962030 A | 7/2019 | |
| CN | 112234015 A | 1/2021 | |
| EP | 1852907 A1 | 11/2007 | |
| JP | S6094247 A | 5/1985 | |
| JP | 2000277599 A | 10/2000 | |
| KR | 10-2014-0050709 A | 4/2014 | |
| KR | 20190010125 A | 1/2019 | |

OTHER PUBLICATIONS

The extended European search report of EP patent application No. 21878877.6 issued on Mar. 7, 2024.
The office action of JP patent application No. 2023-521659 issued on May 14, 2024.
The search report of CN patent application No. 2020110878677 issued on Nov. 5, 2021.
International Search Report of PCT Patent Application No. PCT/CN2021/076783 issued on Jul. 21, 2021.

* cited by examiner

ELECTRODE PATTERN STRUCTURE OF CONCENTRIC-CIRCULAR-STRUCTURED ELECTROSTATIC CHUCK

FIELD OF THE INVENTION

The present invention relates to the field of semiconductor and material science, and specifically relates to an electrode pattern of a concentric-circular-structured electrostatic chuck used in semiconductor manufacturing, and more particularly to a pattern structure.

DESCRIPTION OF THE RELATED ART

In the art of semiconductor, such as semiconductor operations of etching, physical vapor deposition (PVD), chemical vapor deposition (CVD), and ion implanting, an electrostatic chuck is used to stably hold a silicon wafer by means of electrostatic attraction, and is generally operated in severe operation conditions. Thus, the electrostatic chuck used in used operation conditions can only be high temperature co-fired ceramics (HTCC).

For electrostatic chucks of large sizes, such as an electrostatic chuck having a diameter greater than 200 mm, due to the difference of thermal expansion coefficient between the ceramic materials and the metallic electrodes being relatively large, there will be a relatively large residual thermal stress remaining between the metallic electrodes and the ceramic materials after co-sintering. Without being properly resolved, the issue will affect the stability and reliability of the electrostatic chuck in the course of use thereof or, in a worse case, will cause directly cracking and delaminating, resulting in scraping of the ceramic chuck. To reduce the residual thermal stress, except picking materials having similar thermal expansion coefficients, resolution can also be based on the design of the electrode structure. By dividing a large-sized metallic electrode into multiple small-sized areas, the residual thermal stress can be spread, so as to reduce the effect of the residual thermal stress. Further, by making the suction force of an electrostatic chuck uniform during the operation thereof, the surface residual static electricity can be minimized. To reduce residual static electricity, a Japanese innovation technology company proposed a dual-electrode structure, and residual static electricity is eliminated using positive and negative electrodes. Xiao and Sun proposed a six-electrode structure and residual static electricity can be eliminated through switching of the electrodes. No matter what solution is adopted to eliminate the residual static electricity, uniformity of the suction force is also required, and it is necessary for the electrode structure of the electrostatic chuck to be uniform and symmetric. As such, twin-semicircular dual polarity electrode, six-divided circle sextuple electrode, and multiple-unit dual electrode, among which the twin-semicircular dual polarity electrode and six-divided circle sextuple electrode have large division units, which is adverse against reducing of residual thermal stress, and the multiple-unit dual electrode structure form a number of isolated, disconnected electrodes, and issue of connection must be resolved.

SUMMARY OF THE INVENTION

The present invention aims to provide an electrode pattern structure of a concentric-circular-structured electrostatic chuck. An electrostatic chuck electrode of such a structure has excellent symmetry and the structure is homogeneous and simple.

The present invention provides an electrode pattern structure of a concentric-circular-structured electrostatic chuck, and an entire pattern structure is as follows: a center of the electrostatic chuck being an electrode-free small circle, which is a center circle, a plurality of concentric circular rings that are of different diameters and are free of electrode coating layer being arranged outboards of the center circle, and referred to as isolation rings, wherein the isolation rings are respectively defined as a first isolation ring, a second isolation ring, and so on, in sequence in an outward direction from the center circle, and are respectively referred to as an mth isolation ring, and between every two adjacent ones of the isolation rings is an electrode ring, where a first electrode ring is arranged between the center circle and the first isolation ring; a second electrode ring is arranged between the first isolation ring and the second isolation ring; and so on, so that an mth electrode ring is arranged between the (m−1)th isolation ring and the mth isolation ring, and an (m+1)th electrode ring is arranged between the mth isolation ring and the (m+1)th isolation ring.

Each of the electrode rings is provided, in an interior thereof, with a plurality, of linear isolation strips having lengths arranged in diametric directions, and the linear isolation strips are uniformly distributed in the respective electrode ring, where in the electrostatic chuck having a number of x electrodes, a number of $xC_m$ linear isolation strips are provided in the mth electrode ring; the linear isolation strips of the mth electrode ring that are not connected to the mth isolation ring form gaps that are defined as intra-ring top-side connection openings; the linear isolation strips of the mth electrode ring that are not connected to the (m−1)th isolation ring form gaps that are referred to as intra-ring bottom-side connection openings; the linear isolation strips of the first electrode ring that are not connected to a circumference of the center circle form gaps that are defined as centrical connection openings; the linear isolation strips of the mth electrode ring have two ends respectively connected to the (m−1)th isolation ring and the mth isolation ring corresponding thereto, and the mth isolation ring corresponding thereto is formed with an orifice at this site, such that the isolation ring is connected to the linear isolation strip at one side of the orifice and the isolation ring is suspending at the other side of the orifice, and the mth electrode ring is electrically connected to the (m+1)th electrode ring via the orifices, so that the orifice is referred to as an inter-ring connection opening.

The number of the centrical connection openings in each electrode pattern is $xC_1$-x; for each of electrode rings, among all the linear isolation strips, there are, in total, a number of x linear isolation strips that are provided with the inter-ring connection opening; and the linear isolation strips that are provided with the inter-ring connection opening are uniformly distributed in the respective electrode ring to equally divide the respective electrode ring into x sections; with the mth electrode ring being so equally divided into x sections, each of the sections of electrode arc-band is further equally divided by a number of the linear isolation strips, of which the number is not greater than m−1, into a number of $C_m$ size-reduced unit electrode arc-bands, and in the mth electrode ring that is equally divided into x sections, for each of the sections of electrode arc-band, the linear isolation strips corresponding thereto have one end that is formed with the intra-ring bottom-side connection opening or the intra-ring top-side connection opening, and an opposite end directly connected to the isolation ring. Preferably, in the mth electrode ring that is equally divided into x sections, for each of the sections of electrode arc-bands, the linear isolation strips are evenly distributed in a circumferential direction. Wherein $C_1$ and $C_m$ are natural numbers, and $C_m$ increases with increase of m.

In a direction outward from the first electrode ring, the structure of each of the electrode rings is further as follows: the mth electrode ring being interconnected, at each of the electrode arc-bands that are provided with the inter-ring connection opening, through the inter-ring connection opening, with the $C_{m+1}$ unit electrode arc-bands of the (m+1)th electrode ring, and the Cm+1 unit electrode arc-bands are sequentially adjacent and electrically connected to each other, an exit of the inter-ring connection opening of the mth electrode ring (the exit of the inter-ring connection opening of an electrode ring referring to the portion of the inter-ring connection opening corresponding to an outside diameter of the electrode ring) and an exit of the inter-ring connection opening of the (m+1)th electrode ring having an included angle in the circumferential direction, as being are not on the same diameter to present an angular shift, and so on toward the outermost electrode ring, wherein such a connection corresponds to an electrode unit, and there are x such electrode units; and in each of the electrode units, the electrode arc-bands are connected from the first electrode ring to the outermost electrode ring as a one-piece structure.

Preferably, in one electrode unit, exits of the inter-ring connection openings of the electrode arc-bands of the moth electrode ring are located at the mth isolation ring, and the exits of the inter-ring connection openings are evenly distributed in the circumferential direction.

Preferably, the electrode rings or the electrode arc-bands are only metallic electrodes; and the linear isolation strips and the isolation rings are both non-conductive structures that are free of electrode coating layer.

Preferably, forming multiple electrode unit as single electrode, dual electrodes, triple electrodes, quadruple electrodes, quintuple electrodes, or sextuple electrodes, and correspondingly, x=1, 2, 3, 4, 5, 6.

Preferably, $C_m$ is a natural number corresponding to the nail ring, and a value of $C_m$ is a natural number greater than or equal to 1, and the values of Cm for different rings may be different, and with the increase of m, $C_m$ is increased or kept invariable.

Preferably, the center circle that is free of metal electrode has a diameter that is in the range of 0.3 mm to 20 mm. Further preferably, it is in the range of 5 mm to 12 mm.

Preferably, a line width (in diameter direction) of the isolation rings is in the range of 0.03 mm to 5 mm. Further preferably, it is in the range of 0.2 mm to 1.5 mm.

Preferably, a width of the linear isolation strips is in the range of 0.03 mm to 5 mm. Further preferably, it is in the range of 0.2 mm to 1.5 mm.

Preferably, a width (in diameter direction) of the electrode rings is in the range of 0.5 mm to 80 mm. Further preferably, it is in the range of 3 mm to 25 mm.

Preferably, a radial length of the intra-ring bottom-side connection openings or the intra-ring top-side connection openings is in the range of 0.2 mm to 10 mm. Further preferably, it is in the range of 1.0 mm to 5.0 mm.

Preferably, a circumferential length of the inter-ring connection openings is in the range of 0.2 mm to 10 mm. Further preferably, it is in the range of 1.0 mm to 5.0 mm.

In summary, the present invention proposes an electrode pattern structure of a concentric-circular-structured electrostatic chuck. An electrostatic chuck electrode of such a structure can, on the one hand, minimize division units to be advantageous for reduction of residual thermal stress, and on the other hand, avoid generation of isolated electrode during the process of dividing. This is an electrostatic chuck electrode that has excellent symmetry and has a uniform and simple structure. The electrode unit of the electrostatic chuck is divided into a plurality of size-reduced electrode arc-bands, and by means of connecting points of the size-reduced electrode arc-bands, the electrodes of the entire electrostatic chuck can be divided into any desired number of electrodes. For example, when all the size-reduced electrode units can be connected together; and the electrostatic chuck forms a single electrode; and when all of the electrode units are arranged as two portions that are not connected to each other, and the electrostatic chuck forms dual electrodes.

LIST OF REFERENCE SIGNS

Figure 1:
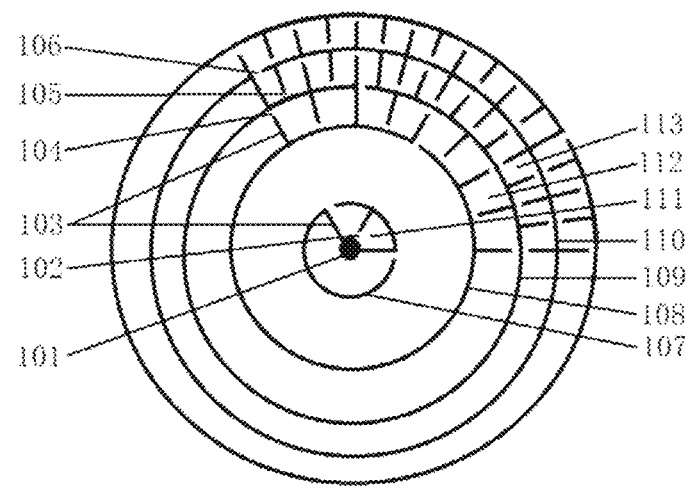
FIG. 1 is a structure diagram of an electrode pattern structure of a concentric-circular-structured electrostatic chuck according to the application, and is also a schematic view illustrating definition of parts.

In FIG. 1, 101: center circle; 102: centrical connection opening; 103: linear isolation strip; 104: intra-ring top-side connection opening; 105: intra-ring bottom-side connection opening; 106: inter-ring connection opening; 107: first isolation ring; 108: (m−1)th isolation ring; 109: mth isolation ring; 110: (m+1)th isolation ring; 111: first electrode ring; 112: mth electrode ring; 113: (m+1)th electrode ring.

Figure 2:
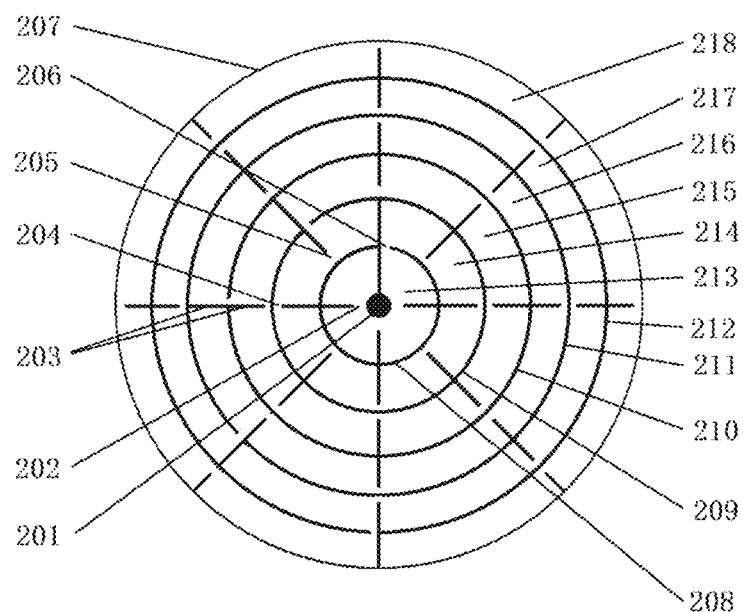
FIG. 2 illustrates an electrode pattern structure of a concentric-circular-structured electrostatic chuck according to EMBODIMENT 1 of the application.

In FIG. 2, 201: center circle; 202: centrical connection opening; 203: linear isolation strip; 204: intra-ting top-side connection opening; 205: intra-ring bottom-side connection opening; 206: inter-ring connection opening; 207: electrode maximum-diameter circumference; 208: first isolation ring; 209: second isolation ring; 210: third isolation ring; 211: fourth isolation ring; 212: the isolation ring; 213: first electrode ring; 214: second electrode ring; 215: third electrode ring; 216: fourth electrode ring; 217: fifth electrode ring; 218: sixth electrode ring.

Figure 3:
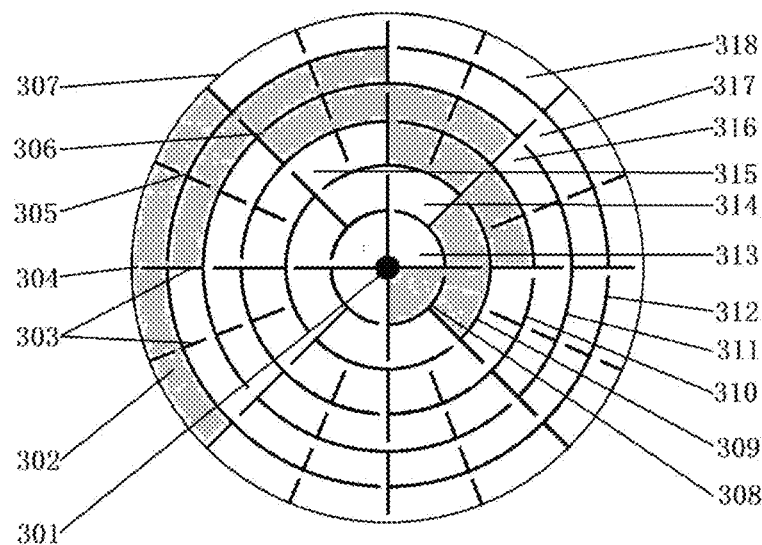
FIG. 3 illustrates an electrode pattern structure of a concentric-circular-structured electrostatic chuck according to EMBODIMENT 2 of the application.

In FIG. 3, 301: center circle; 302: individual electrode pattern; 303: linear isolation strip; 304: intra-ring top-side connection opening; 305: intra-ring bottom-side connection opening; 306: inter-ring connection opening; 307: electrode maximum-diameter circumference; 308: first isolation ring; 309: second isolation ring; 310: third isolation ring; 311: fourth isolation ring; 312: fifth isolation ring; 313: first electrode ring; 314: second electrode ring; 315: third electrode ring; 316: fourth electrode ring; 317: fifth electrode ring; 318: sixth electrode ring.

Figure 4:
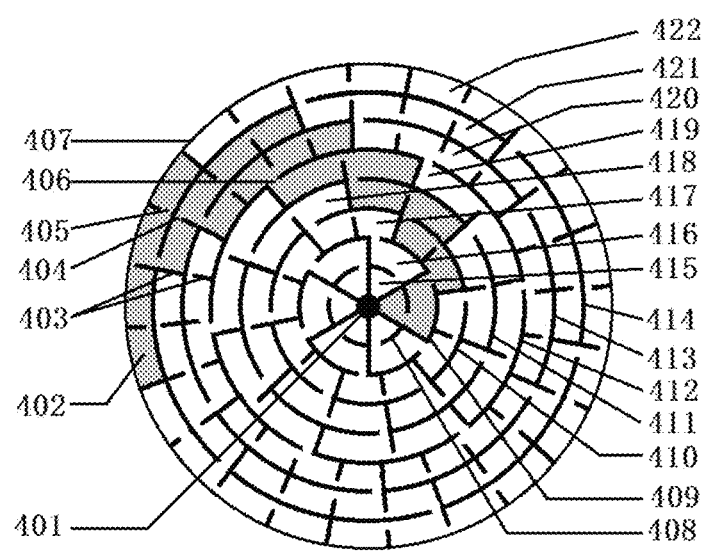
FIG. 4 illustrates an electrode pattern structure of a concentric-circular-structured electrostatic chuck according to EMBODIMENT 3 of the application.

In FIG. 4, 401: center circle; 402: individual electrode pattern; 403: linear isolation strip; 404: intra-ring top-side connection opening; 405: intra-ring bottom-side connection opening; 406: inter-ring connection opening; 407: electrode maximum-diameter circumference; 408: first isolation ring; 409: second isolation ring; 410: third isolation ring; 411: fourth isolation ring; 412: fifth isolation ring; 413: sixth isolation ring; 414: seventh isolation ring; 415: first electrode ring; 416: second electrode ring; 417: third electrode ring; 418: fourth electrode ring; 419: fifth electrode ring; 420: sixth electrode ring; 421: seventh electrode ring; 422: eighth electrode ring.

DETAILED DESCRIPTION OF PREFERRED EMBODIMENTS OF THE INVENTION

Before a detailed description is given to embodiments, it is noted that the present invention is not limited to detailed structures or arrangement of component described in the following text or the drawings of the application. The present invention can be of implementations that are realized in other ways. Further, it is noted that the wordings and terminology used herein are only for the purposes of illustration, and should not be interpreted as being limitative. The terms "comprise", "include", "contain" and "have", or other wordings of similar meanings, as used herein, refer to inclusion of items listed subsequent thereto, equivalent objects, and other additive items. Particularly, for a description of "an element", the present invention does not limit the number of the element to be just one, and it may alternatively be plural.

In the following, various ways of implementation of the present invention will be described with reference to the attached drawings. Further, the present invention is not limited to the following ways of implementation, and various modifications are contemplated based on the technical idea of the present invention.

As shown in FIG. 1, FIG. 1 is a structure diagram of an electrode pattern structure of a concentric-circular-structured electrostatic chuck according to the application, and is also a schematic view illustrating definition of parts. A pattern structure of the entire concentric-circular-structured electrostatic chuck is as follows: the center of the electrostatic chuck is an electrode-free small circle, which is the center circle 101, and a plurality of concentric circular rings that are of different diameters and are free of electrode coating layer are arranged outboards of the center circle 101, and are referred to as isolation rings. The isolation rings are respectively defined as a first isolation ring 107, a second isolation ring, and so on, in sequence in an outward direction from the center circle 101, and are respectively referred to as an mth isolation ring. Between every two adjacent ones of the isolation rings is an electrode ring, where a first electrode ring 111 is arranged between the center circle 101 and the first isolation ring; a second electrode ring is arranged between the first isolation ring 107 and the second isolation ring; and so on, so that the mth electrode ring 112 is arranged between the (m−1)th isolation ring 108 and the mth isolation ring 109, and the (m+1)th electrode ring 113 is arranged between the mth isolation ring 109 and the (m+1)th isolation ring 110.

Each of the electrode rings is provided, in an interior thereof, with a plurality of linear isolation strips 103 (which are free of electrode coating layer) having lengths arranged in diametric directions, and the linear isolation strips 103 are uniformly distributed in the respective electrode ring. In the electrostatic chuck having a number of x electrodes, a number of $xC_m$ linear isolation strips 103 are provided in the mth electrode ring 112. The linear isolation strips 103 of the mth electrode ring 112 that are not connected to the mth isolation ring 109 form gaps that are defined as intra-ting top-side connection openings 104. The linear isolation strips 103 of the mth electrode ring 112 that are not connected to the (m−1)th isolation ring 108 form gaps that are referred to as intra-ring bottom-side connection openings 105. The linear isolation strips 103 of the first electrode ring 111 that are not connected to a circumference of the center circle 101 form gaps that are defined as centrical connection openings 102. The linear isolation strips 103 of the mth electrode ring 112 have two ends respectively connected to the (m−1)th isolation ring 108 and the mth isolation ring 109 corresponding thereto, and the mth isolation ring 109 corresponding thereto is formed with an orifice at this site, such that the isolation ring is connected to the linear isolation strip 103 at one side of the orifice and the isolation ring is suspending at the other side of the orifice, and the mth electrode ring 112 is electrically connected to the (m+1)th electrode ring 113 via the orifices, and the orifice is referred to as an inter-ring connection opening 106.

In each electrode pattern, the number of the centrical connection openings 102 is $xC_1$-x; for each of electrode rings, among all the linear isolation strips 103, there are, in total, a number of x linear isolation strips 103 that are provided with the inter-ring connection opening 106, and the linear isolation strips 103 that are provided with the inter-ring connection opening 106 are uniformly distributed in the respective electrode ring to equally divide the respective electrode ring into x sections. With the trait electrode ring 112 being so equally divided into x sections, each of the sections of electrode arc-band is further equally divided by a number of the linear isolation strips 103, of which the number is not greater than m−1, into a number of $C_m$ size-reduced unit electrode arc-bands. In the mth electrode ring 112 that is equally divided into x sections, for each of the sections of electrode arc-band, the linear isolation strips 103 corresponding thereto (namely the linear isolation strips 103 of which the number is not greater than m−1) have one end that is formed with the intra-ting bottom-side connection opening 105 or the intra-ring top-side connection opening 104, and an opposite end directly connected to the isolation ring. Preferably, in the mth electrode ring 112 that is equally divided into x sections, for each of the sections of electrode arc-band, the linear isolation strips 103 are evenly distributed in the circumferential direction of the electrode ring.

In a direction outward from the first electrode ring 111, the structure of each of the electrode rings is further as follows: the mth electrode ring 112 is interconnected, at each of the electrode arc-bands that are provided with the inter-ring connection opening 106, through the inter-ring connection opening 106, with the $C_{m+1}$ unit electrode arc-bands of the (m+1)th electrode ring 113, and the Cm+1 unit electrode arc-bands are sequentially adjacent and connected such that the Cm+1 unit electrode arc-bands are electrically connected to each other. An exit of the inter-ring connection opening 106 of the mth electrode ring 112 (the exit of the inter-ring connection opening 106 of an electrode ring referring to the portion of the inter-ring connection opening 106 corresponding to an outside diameter of the electrode ring) and an exit of the inter-ring connection opening 106 of the (m+1)th electrode ring 113 have an included angle in the circumferential direction, as being not on the same diameter to present an angular shift, and so on toward the outermost electrode ring. Such a connection corresponds to an electrode unit, and there are x such electrode units; and in each of the electrode units, the electrode arc-bands are connected from the first electrode ring 111 to the outermost electrode ring as a one-piece structure.

Further, preferably, in one electrode unit, locations of the exits of the inter-ring connection openings 106 of the electrode arc-bands of the mth electrode ring 112 are at circumferentially symmetric locations on the electrode arc-bands of the (m+1)th electrode ring 113.

Preferably, the electrode rings or the electrode arc-bands are only metallic electrodes; and the linear isolation strips and the isolation rings are both non-conductive structures that are free of electrode coating layer.

Preferably, the linear isolation strips and the isolation rings have predetermined line widths.

Preferably, various desired electrode units are formed as being single electrode, dual electrodes, triple electrodes, quadruple electrodes, quintuple electrodes, and sextuple electrodes, meaning, correspondingly, x=1, 2, 3, 4, 5, 6.

Preferably, $C_m$ is a natural number corresponding to the mth ring, and a value of $C_m$ is a natural number greater than or equal to 1, and the values of $C_m$ for different rings can be different, and generally, with the increase of m, $C_m$ may be increased or kept invariable.

Preferably, the center circle that is free of metal electrode has a diameter that is in the range of 0.3 mm to 20 mm. Further, it is a value preferably in the range of 5 mm to 12 mm.

Preferably, a line width of the isolation rings (in the radial direction) is in the range of 0.03 mm to 5 mm. Further, it is a value preferably in the range of 0.2 mm to 1.5 mm.

Preferably, a width of the linear isolation strips is in the range of 0.03 mm to 5 mm. Further, it is a value preferably in the range of 0.2 mm to 1.5 mm.

Preferably, a width of the electrode rings (in the radial direction) is in the range of 0.5 mm to 80 mm. Further, it is a value preferably in the range of 3 mm to 25 mm.

Preferably, a radial length of the intra-ring bottom-side connection openings or the intra-ring top-side connection openings is in the range of 0.2 mm to 10 mm. Further, it is a value preferably in the range of 1.0 mm to 5.0 mm.

Preferably, a circumferential length of the inter-ring connection openings is in the range of 0.2 ram to 10 mm. Further, it is a value preferably in the range of 1.0 mm to 5.0 mm.

Embodiment 1

This is an electrode pattern structure of a single-electrode concentric-circular-structured electrostatic chuck, and as shown in FIG. 2, the entire structure forms one single electrode through interconnection among the unit electrode arc-bands of all of the electrode rings.

Specifically, the pattern structure of the entire single-electrode concentric-circular-structured electrostatic chuck is as follow: the center of the electrostatic chuck is an electrode-free small circle, which is center circle 201, and a plurality of concentric circular rings that are of different diameters and are free of electrode coating layer are arranged outboard of the center circle 201, and are referred to as isolation rings. The isolation rings are respectively defined, in sequence in an outward direction from the center circle 201, as a first isolation ring 208, a second isolation ring 209, a third isolation ring 210, a fourth isolation ring 211, a fifth isolation ring 212, and an electrode maximum-diameter circumference 207, wherein the electrode maximum-diameter circumference 207 is also referred to as a sixth isolation ring. Between every two adjacent ones of the isolation rings is an electrode ring, where a first electrode ring 213 is arranged between the center circle 201 and the first isolation ring 208; a second electrode ring 214 is arranged between the first isolation ring 208 and the second isolation ring 209; a third electrode ring 215 is arranged between the second isolation ring 209 and the third isolation ring 210; a fourth electrode ring 216 is arranged between the third isolation ring 210 and the fourth isolation ring 211; a fifth electrode ring 217 is arranged between the fourth isolation ring 211 and the fifth isolation ring 212; and a sixth electrode ring 218 is arranged between the fifth isolation ring 212 and the electrode maximum-diameter circumference 207.

Each of the electrode rings is provided, in an interior thereof, with a plurality of linear isolation strips 203 (Which are free of electrode coating layer) having lengths arranged in diametric directions, and the linear isolation strip 203 are uniformly distributed in the respective electrode ring. In the electrostatic chuck having a number of x electrodes, a number of $xC_m$ linear isolation strips 203 are provided in the mth electrode ring. The linear isolation strips 203 of the mth electrode ring that are not connected to the mth isolation ring form gaps that are defined as intra-ring top-side connection opening 204. The linear isolation strips 203 of the mth electrode ring that are not connected to the (m−1)th isolation ring form gaps that are defined as intra-ring bottom-side connection opening 205. The linear isolation strips 203 of the first electrode ring 213 that are not connected to a circumference of the center circle 201 form gaps that are defined as centrical connection openings 202. The linear isolation strips 203 of the mth electrode ring have two ends respectively connected to the (m−1)th isolation ring and the mth isolation ring corresponding thereto, and the mth isolation ring corresponding thereto is formed with an orifice at this site, such that the isolation ring is connected to the linear isolation strip 203 at one side of the orifice and the isolation ring is suspending at the other side of the orifice, and the mth electrode ring is electrically connected to to the (m+1)th electrode ring by the orifices, and the orifice is referred to as an inter-ring connection opening 206.

In each electrode pattern, the number of the centrical connection openings 202 is $xC_1$-x, and the instant embodiment is the electrode pattern structure of a single-electrode concentric-circular-structured electrostatic chuck, and thus, x=1, and the number of the centrical connection openings 202 in each electrode pattern is $C_1$-1. For each of the electrode rings, among all the linear isolation strips 203, there is one linear isolation strip 203 that is provided with the inter-ring connection opening 206, and the linear isolation strip 203 that is provided with the inter-ring connection opening 206 is uniformly distributed in the respectively electrode ring to make the electrode ring as one single section. With the mth electrode ring being made as one single section, the section of electrode arc-band is further equally divided by a number of the linear isolation strip 203, of which the number if not greater than m−1, into a number of $C_m$ unit electrode arc-bands of a reduced size. In the mth electrode ring that is made as one single section, for the section of electrode arc-band, the linear isolation strips 203 corresponding thereto (namely the linear isolation strips 203 of which the number is not greater than m−1) have one end that is formed with the intra-ring bottom-side connection opening 205 or the intra-ring top-side connection opening 204, and an opposite end that is directly connected to the isolation ring. Preferably, in the mth electrode ring that is made as one single section, for the section of electrode arc-band, the linear isolation strips 103 are evenly distributed in the circumferential direction of the electrode ring.

In a direction outward from the first electrode ring 213, the structure of each of the electrode rings is further as follows: the mth electrode ring is interconnected, at each of the electrode arc-bands that include the inter-ring connection opening 206, through the inter-ring connection opening 206, with the $C_{m+1}$ unit electrode arc-bands of the (m+1)th electrode ring, and the Cm+1 unit electrode arc-bands are sequentially adjacent and connected such that the Cm+1 unit electrode arc-bands are electrically connected to each other. An exit of the inter-ring connection opening 206 of the mth electrode ring (the exit of the inter-ring connection opening 206 of the electrode ring referring to the portion of the inter-ring connection opening 206 corresponding to an outside diameter of the electrode ring) and an exit of the inter-ring connection opening 206 of the (m+1)th electrode ring have an included angle in the circumferential direction, as being not on the same diameter to present an angular shift, and so on toward the outermost electrode ring. Such a connection corresponds to an electrode unit, and there is a single one such electrode unit. And, in the electrode unit, the electrode arc-bands are connected from the first electrode ring 213 to the outermost electrode ring as a one-piece structure.

In the instant embodiment, there are six (6) isolation rings outboard of the center circle 201, and consequently, m is a natural number from 1 to 6.

Embodiment 2

This is an electrode pattern structure of a quadruple-electrode concentric-circular-structured electrostatic chuck, and as shown in FIG. 3, the entire structure forms, in total, four independent electrodes, wherein the gray hatching illustrates a connection relationship for one of the independent electrodes.

Specifically, the pattern structure of the entire quadruple-electrode concentric-circular-structured electrostatic chuck is as follow: the center of the electrostatic chuck is an electrode-free small circle, which is center circle 301, and a plurality of concentric circular rings that are of different diameters and are free of electrode coating layer are arranged outboard of the center circle 301, and are referred to as isolation rings. The isolation rings are respectively defined, in sequence in an outward direction from the center circle 301, as a first isolation ring 308, a second isolation ring 309, a third isolation ring 310, a fourth isolation ring 311, a fifth isolation ring 312, and an electrode maximum-diameter circumference 307 located outermost, wherein the electrode maximum-diameter circumference 307 is also referred to as a sixth isolation ring. Between every two adjacent ones of the isolation rings is an electrode ring, where a first electrode ring 313 is arranged between the center circle 301 and the first isolation ring 308; a second electrode ring 314 is arranged between the first isolation ring 308 and the second isolation ring 309; a third electrode ring 315 is arranged between the second isolation ring 309 and the third isolation ring 310; a fourth electrode ring 316 is arranged between the third isolation ring 310 and the fourth isolation ring 311; a fifth electrode ring 317 is arranged between the fourth isolation ring 311 and the fifth isolation ring 312; and a sixth electrode ring 318 is arranged between the fifth isolation ring 312 and the electrode maximum-diameter circumference 307.

Each of the electrode rings is provided, in an interior thereof, with a plurality of linear isolation strips 303 (which are free of electrode coating layer) having lengths arranged in diametric directions, and the linear isolation strips 303 are uniformly distributed in the respective electrode ring. In the electrostatic chuck having a number of x electrodes, a number of $xC_m$ linear isolation strips 303 are provided in the mth electrode ring. The linear isolation strips 303 of the mth electrode ring that are not connected to the mth isolation ring form gaps that are defined as intra-ring top-side connection openings 304. The linear isolation strips 303 of the mth electrode ring that are not connected to the (m−1)th isolation ring form gaps that are referred to as intra-ring bottom-side connection openings 305. The linear isolation strips 303 of the mth electrode ring have two ends respectively connected to the (m−1)th isolation ring and the mth isolation ring corresponding thereto, and the mth isolation ring corresponding thereto is formed with an orifice at this site, such that the isolation ring is connected to the linear isolation strip 303 at one side of the orifice, and the isolation ring is suspending at one side of the orifice, and the mth electrode ring is electrically connected to the (m+1)th electrode ring by the orifices, and the orifice is referred to as an inter-ring connection opening 306.

The instant embodiment is the electrode pattern structure of a quadruple-electrode concentric-circular-structured electrostatic chuck, and thus, x=4.

For each of the electrode rings, among all the linear isolation strips 303, there are, in total, four (4) linear isolation strips 303 that are provided with the inter-ring connection opening 306, and the linear isolation strips 303 that are provided with the inter-ring connection opening 306 are uniformly distributed in the respective electrode ring to equally divide the respective electrode ring into four (4) sections. With the mth electrode ring being so equally divided into four sections, each of the sections of electrode arc-band is further equally divided by a number of the linear isolation strips 303, of which the number is not greater than m−1, into a number of $C_m$ unit electrode arc-bands of a reduced size. In the mth electrode ring that is equally divided into four sections, for each of the sections of electrode arc-band, the linear isolation strips 303 corresponding thereto (namely the linear isolation strips 303 of which the number is not greater than m−1) have one end that is formed with the intra-ring bottom-side connection opening 305 or the intra-ring top-side connection opening 304, and an opposite end that is directly connected to the isolation ring. Preferably, in the mth electrode ring that is equally divided in to four sections, for each of the sections of electrode arc-band, the linear isolation strips 103 are evenly distributed in the circumferential direction of the electrode ring.

In a direction outward from the first electrode ring 313, the structure of each of the electrode rings is further as follows: the mth electrode ring is interconnected, at each of the electrode arc-bands that include the inter-ring connection opening 306, through the inter-ring connection opening 306, with the $C_{m+1}$ unit electrode arc-bands of the (m+1)th electrode ring, and axis lines of the $C_{m+1}$ unit electrode arc-bands are sequentially adjacent and connected. An exit of the inter-ring connection opening 306 of the mth electrode ring (the exit of the inter-ring connection opening 306 of the electrode ring referring to the inter-ring connection opening 306 corresponding to an outside diameter of the electrode ring) and an exit of the inter-ring connection opening 306 of the (m+1)th electrode ring have an included angle in the circumferential direction, as being not on the same diameter to present an angular shift, and so on toward the outermost electrode ring. Such a connection corresponds to an electrode unit, and there are four such electrode units in total. And, in each of the electrode units, the electrode arc-bands are connected from the first electrode ring 313 to the outermost electrode ring as a one-piece structure. Reference is made to the electrode pattern 302 in the drawings.

In the instant embodiment, there are six (6) isolation rings outboard of the center circle 301, and consequently, m is a natural number from 1 to 6.

Embodiment 3

This is an electrode pattern structure of a sextuple-electrode concentric-circular-structured electrostatic chuck, and as shown in FIG. 4, the entire structure forms, in total, six independent electrodes, wherein the gray hatching illustrates a connection relationship for one of the independent electrodes.

Specifically, the pattern structure of the entire sextuple-electrode concentric-circular-structured electrostatic chuck is as follow: the center of the electrostatic chuck is an electrode-free small circle, which is the center circle 401, and a plurality of concentric circular rings that are of different diameters and are free of electrode coating layer are arranged outboard of the center circle 401, and are referred to as isolation rings. The isolation rings are respectively defined, in sequence in an outward direction from the center circle 401, as a first isolation ring 408, a second isolation ring 409, a third isolation ring 410, a fourth isolation ring 411, a fifth isolation ring 412, a sixth isolation ring 413, a seventh isolation ring 414, and an electrode maximum-diameter circumference 407 located outermost, wherein the electrode maximum-diameter circumference 407 is also referred to as an eighth isolation ring. Between every two adjacent ones of the isolation rings is an electrode ring; where a first electrode ring 415 is arranged between the center circle 401 and the first isolation ring 408; a second electrode ring 416 is arranged between the first isolation ring 408 and the second isolation ring 409; a third electrode ring 417 is arranged between the second isolation ring 409 and the third isolation ring 410; a fourth electrode ring 418 is arranged between the third isolation ring 410 and the fourth isolation ring 411; a fifth electrode ring 419 is arranged between the fourth isolation ring 411 and the fifth isolation ring 412; a sixth electrode ring 420 is arranged between the fifth isolation ring 412 and the sixth isolation ring 413; a seventh electrode ring 421 is arranged between the sixth isolation ring 413 and the seventh isolation ring 414; and an eighth electrode ring 422 is arranged between the seventh isolation ring 414 and the electrode maximum-diameter circumference 407.

Each of the electrode rings is provided, in an interior thereof, with a plurality of linear isolation strips 403 (which are free of electrode coating layer) having lengths arranged in diametric directions, and the linear isolation strips 403 are uniformly distributed in the respective electrode ring. In the electrostatic chuck having a number of x electrodes, a number of $xC_m$ linear isolation strips 403 are provided in the mth electrode ring. The linear isolation strips 403 of the mth electrode ring that are not connected to the mth isolation ring form gaps that are defined as intra-ring top-side connection openings 404. The linear isolation strips 403 of the mth electrode ring that are not connected to the (m−1)th isolation ring form gaps that are referred to as intra-ring bottom-side connection openings 405. The linear isolation strips 403 of the mth electrode ring have two ends respectively connected to the (m−1)th isolation ring and the mth isolation ring corresponding thereto, and the mth isolation ring corresponding thereto is formed with an orifice at this site, such that the isolation ring is connected to the linear isolation strip 403 at one side of the orifice and the isolation ring is suspending at the other side of the orifice, and the mth electrode ring is electrically connected to the (m+1)th electrode ring via the orifices, and the orifice is referred to as an inter-ring connection opening 406.

The instant embodiment is the electrode pattern structure of a sextuple-electrode concentric-circular-structured electrostatic chuck; and thus, x=6.

For each of the electrode rings, among all the linear isolation strips 403, there are, in total, six (6) linear isolation strips 403 that are provided with the inter-ring connection opening 406, and the linear isolation strips 403 that are provided with the inter-ring, connection opening 406 are uniformly distributed m the respective electrode ring to equally divide the respective electrode ring into six (6) sections. With the mth electrode ring being so equally divided into six sections, each of the sections of electrode arc-band is further equally divided by a number of the linear isolation strips 403, of which the number is not greater than m−1, into a number of $C_m$ unit electrode arc-bands of a reduced size. In the mth electrode ring that is equally divided into six sections, for each of the sections of electrode arc-band, the linear isolation strips 403 corresponding thereto (namely the linear isolation strips 403 of which the number is not greater than m−1) have one end that is formed with the intra-ring bottom-side connection opening 405 or the intra-ring top-side connection opening 404, and an opposite end that is directly connected to the isolation ring. Preferably, in the mth electrode ring that is equally divided in to six sections, for each of the sections of electrode arc-band, a positional relationship of distribution of the linear isolation strips 403 is symmetric in a circumferential direction.

In a direction outward from the first electrode ring 415, the structure of each of the electrode rings is further as follows: the mth electrode ring is interconnected, at each of the electrode arc-bands that include the inter-ring connection opening 406, through the inter-ring connection opening 406, with the $C_{m+1}$ unit electrode arc-bands of the (m+1)th electrode ring, and axis lines of the $C_{m+1}$ unit electrode arc-bands are sequentially adjacent and connected. An exit of the inter-ring connection opening 406 of the mth electrode ring (the exit of the inter-ring connection opening 406 of an electrode ring referring to the inter-ring connection opening 406 corresponding to the outside diameter of the electrode ring) and an exit of the inter-ring connection opening 406 of the (m+1)th electrode ring have an included angle in the circumferential direction, as being not on the same diameter to present an angular shift exists, and so on toward the outermost electrode ring. Such a connection corresponds to an electrode unit, and there are six such electrode units in total; and in each of the electrode units, the electrode arc-bands are connected from the first electrode ring 415 to the outermost electrode ring as a one-piece structure. Reference is made to the electrode pattern 402 in the drawings.

In the instant embodiment, there are eight (8) isolation rings outboard of the center circle 401, and consequently, m is a natural number from 1 to 8.

In summary, the present invention proposes an electrode pattern structure of a concentric-circular-structured electrostatic chuck. An electrostatic chuck electrode of such a structure can, on the one hand, minimize division units to be advantageous for reduction of residual thermal stress, and on the other hand, avoid generation of isolated electrode during the process of dividing. This is an electrostatic chuck electrode that has excellent symmetry and has a uniform and simple structure. The electrode unit of the electrostatic chuck is divided into a plurality of size-reduced electrode arc-bands, and by means of arrangement of inter-ring connection openings of the size-reduced electrode arc-bands, the electrodes of the entire electrostatic chuck can be divided into any desired number of electrodes. For example, all the size-reduced electrode units can be connected together, and the electrostatic chuck includes a single electrode; and all of the electrode units can be arranged as two portions that are not connected to each other, and the electrostatic chuck includes dual electrodes.

The concept described in the disclosure can be implemented in other forms without departing from the sprit and characteristics thereof. The disclosed embodiments should be regarded as illustrative, rather than limitative. Thus, the scope of the present invention is defined by the appended claims, rather than the description provided above. All variations that fall in the literal meaning of the claims, or an equivalent scope thereof, belong to the scope defined by the claims.

What is claimed is:

1. An electrode pattern structure of a concentric-circular-structured electrostatic chuck, wherein the electrode pattern structure comprises: a center of the electrostatic chuck being an electrode-free small circle, which is a center circle, a plurality of concentric circular rings that are of different diameters and are free of electrode coating layer being arranged outboards of the center circle, and referred to as isolation rings, wherein the isolation rings are respectively defined as a first isolation ring, a second isolation ring, and so on, in sequence in an outward direction from the center circle, and are respectively referred to as an mth isolation ring, and between every two adjacent ones of the isolation rings is an electrode ring, where a first electrode ring is arranged between the center circle and the first isolation ring; a second electrode ring is arranged between the first isolation ring and the second isolation ring; and so on, so that an mth electrode ring is arranged between the (m−1)th isolation ring and the mth isolation ring, and an (m+1)th electrode ring is arranged between the mth isolation ring and the (m+1)th isolation ring;

wherein in the electrostatic chuck having a number of x electrodes, the mth electrode ring is provided with a number of x linear isolation strips each having a length extending in a diameter direction, each of the linear isolation strips have two ends respectively connected to the (m−1)th isolation ring and the mth isolation ring corresponding thereto such that the mth electrode ring is divided into x sections of electrode arc-bands by the number of x linear isolation strips, and the mth isolation ring is formed with an orifice at a site corresponding to each of the linear isolation strips, such that the mth isolation ring is connected to the linear isolation strip at one side of the orifice and the mth isolation ring at the other side of the orifice is spaced from the linear isolation strip, and the mth electrode ring is electrically connected to the (m+1)th electrode ring by the orifices, the orifice is referred to as an inter-ring connection opening.

2. The electrode pattern structure of the concentric-circular-structured electrostatic chuck according to claim 1, wherein each of the sections of electrode arc-bands of the mth electrode ring is further divided by additional linear isolation strips, of which the number is not greater than m−1, into a number of $C_m$ size-reduced unit electrode arc-bands;

the additional linear isolation strips in the mth electrode ring that are not connected to the mth isolation ring form gaps that are defined as intra-ring top-side connection openings;

the additional linear isolation strips in the mth electrode ring that are not connected to the (m−1)th isolation ring form gaps that are defined as intra-ring bottom-side connection openings; and the additional linear isolation strips in the mth electrode ring each have one end that is formed with the intra-ring bottom-side connection opening or the intra-ring top-side connection opening, and an opposite end directly connected to a corresponding one of the isolation rings;

wherein $C_m$ is a natural number corresponding to the mth ring, and a value of $C_m$ is a natural number greater than or equal to 1, and with the increase of m, $C_m$ is increased or kept invariable.

3. The electrode pattern structure of the concentric-circular-structured electrostatic chuck according to claim 2, wherein in each of the sections of electrode arc-bands of the mth electrode ring, the additional linear isolation strips, of which the number is not greater than m−1, are evenly distributed in a circumferential direction.

4. The electrode pattern structure of the concentric-circular-structured electrostatic chuck according to claim 3, wherein in each of the electrode rings, the number of x linear isolation strips are evenly distributed in the circumferential direction.

5. The electrode pattern structure of the concentric-circular-structured electrostatic chuck according to claim 2, wherein in each of the electrode rings, the number of x linear isolation strips are evenly distributed in a circumferential direction.

6. The electrode pattern structure of the concentric-circular-structured electrostatic chuck according to claim 2, wherein in a direction outward from the first electrode ring, the structure of each of the electrode rings further comprises: each of the electrode arc-bands of the mth electrode ring that are provided with the inter-ring connection openings, being interconnected through a corresponding one of the inter-ring connection openings, with the $C_{m+1}$ unit electrode arc-bands of the (m+1)th electrode ring, an exit of the inter-ring connection opening of the mth electrode ring and an exit of the inter-ring connection opening of the (m+1)th electrode ring having an included angle in the circumferential direction, and so on toward the outermost electrode ring, wherein such a connection corresponds to an electrode unit, and there are the number of x such electrode units; and in each of the electrode units, the electrode arc-bands are connected from the first electrode ring to the outermost electrode ring as a one-piece structure.

7. The electrode pattern structure of the concentric-circular-structured electrostatic chuck according to claim 6, wherein in one of the electrode units, exits of the inter-ring connection openings of the electrode arc-bands of the mth electrode ring are located at the mth isolation ring, and the exits of the inter-ring connection openings are evenly distributed in the circumferential direction.

8. The electrode pattern structure of the concentric-circular-structured electrostatic chuck according to claim 1, wherein the electrode rings or the electrode arc-bands form metallic electrodes; and the linear isolation strips and the isolation rings are both non-conductive structures that are free of electrode coating layer.

9. The electrode pattern structure of the concentric-circular-structured electrostatic chuck according to claim 1, wherein the number of x electrodes comprises single electrode, dual electrodes, triple electrodes, quadruple electrodes, quintuple electrodes, or sextuple electrodes, and correspondingly, x=1, 2, 3, 4, 5, or 6.

10. The electrode pattern structure of the concentric-circular-structured electrostatic chuck according to claim 1, wherein the center circle that is free of metal electrode has a diameter that is in the range of 0.3 mm to 20 mm;

a line width of the isolation rings is in the range of 0.03 mm to 5 mm;

a width of the linear isolation strips is in the range of 0.03 mm to 5 mm;

a width of the electrode rings is in the range of 0.5 mm to 80 mm;

a radial length of the intra-ring bottom-side connection openings or the intra-ring top-side connection openings is in the range of 0.2 mm to 10 mm; and a circumferential length of the inter-ring connection openings is in the range of 0.2 mm to 10 mm.

11. The electrode pattern structure of the concentric-circular-structured electrostatic chuck according to claim 10, wherein the diameter of the center circle that is free of metal electrode is in the range of 5 mm to 12 mm;

the line width of the isolation rings is in the range of 0.2 mm to 1.5 mm;

the width of the linear isolation strips is in the range of 0.2 mm to 1.5 mm;

the width of the electrode rings is in the range of 3 mm to 25 mm;

the radial length of the intra-ring bottom-side connection openings or the intra-ring top-side connection openings is in the range of 1.0 mm to 5.0 mm; and the circumferential length of the inter-ring connection openings is in the range of 1.0 mm to 5.0 mm.

12. The electrode pattern structure of the concentric-circular-structured electrostatic chuck according to claim 1, wherein the linear isolation strips of the first electrode ring that are not connected to a circumference of the center circle form gaps that are defined as centrical connection openings, and the number of the centrical connection openings in the electrode pattern is $xC_1$-x, wherein $C_1$ is a natural number.

* * * * *